United States Patent
Tien et al.

(10) Patent No.: US 7,821,039 B2
(45) Date of Patent: Oct. 26, 2010

(54) LAYOUT ARCHITECTURE FOR IMPROVING CIRCUIT PERFORMANCE

(75) Inventors: Li-Chun Tien, Tainan (TW);
Lee-Chung Lu, Taipei (TW);
Yung-Chin Hou, Taipei (TW);
Chun-Hui Tai, Hsin-Chu (TW); Ta-Pen Guo, Cupertino, CA (US); Sheng-Hsin Chen, Jhubei (TW); Ping Chung Li, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 250 days.

(21) Appl. No.: 12/193,354

(22) Filed: Aug. 18, 2008

(65) Prior Publication Data
US 2009/0315079 A1    Dec. 24, 2009

Related U.S. Application Data

(60) Provisional application No. 61/074,933, filed on Jun. 23, 2008.

(51) Int. Cl.
H01L 27/10    (2006.01)
H01L 23/62    (2006.01)
H01L 29/76    (2006.01)
H01L 29/94    (2006.01)
H01L 29/00    (2006.01)

(52) U.S. Cl. ............... 257/207; 257/369; 257/532; 257/355

(58) Field of Classification Search ............ 257/207, 257/369, 213, 532, 355, 371, 333, 363, 370, 257/378, 208, 211, 204, 610, 347, 256
See application file for complete search history.

(56) References Cited

U.S. PATENT DOCUMENTS

| 4,319,342 | A | * | 3/1982 | Scheuerlein | 365/149 |
|---|---|---|---|---|---|
| 4,682,201 | A | | 7/1987 | Lipp | |
| 5,019,889 | A | * | 5/1991 | Shintani et al. | 331/108 C |
| 6,242,767 | B1 | * | 6/2001 | How et al. | 257/202 |
| 7,219,324 | B1 | | 5/2007 | Sherlekar et al. | |
| 7,603,634 | B2 | * | 10/2009 | Sluss et al. | 716/1 |

* cited by examiner

*Primary Examiner*—Chuong Anh Luu
(74) *Attorney, Agent, or Firm*—Slater & Matsil, L.L.P.

(57) ABSTRACT

An integrated circuit structure includes an integrated circuit structure including a PMOS transistor including a first gate electrode; a first source region; and a first drain region; an NMOS transistor including a second gate electrode, wherein the first gate electrode and the second gate electrode are portions of a gate electrode strip; a second source region; and a second drain region. No additional transistors are formed between the PMOS transistor and the NMOS transistor. The integrated circuit further includes a VDD power rail connected to the first source region; a VSS power rail connected to the second source region; and an interconnection port electrically connected to the gate electrode strip. The interconnection port is on an outer side of a MOS pair region including the PMOS transistor, the NMOS transistor, and the region between the PMOS transistor and the NMOS transistor. The portion of the gate electrode strip in the MOS pair region is substantially straight.

29 Claims, 12 Drawing Sheets

LAYOUT ARCHITECTURE FOR IMPROVING CIRCUIT PERFORMANCE

CROSS REFERENCES

This application claims the benefit of the following provisionally filed U.S. Patent application: Application Ser. No. 61/074,933, filed Jun. 23, 2008, and entitled "Layout Architecture for Improving Circuit Performance," which application is hereby incorporated herein by reference.

TECHNICAL FIELD

This invention relates generally to integrated circuits, and more particularly to optimizing the layouts of integrated circuits.

BACKGROUND

With the increasing down-scaling of integrated circuits, the integrated circuits become more compact, and some restricted design rules have to be applied, which have become major limitations in the layout design. For standard cells that are frequently used in the integrated circuits, these restricted design rules cause the increase in the chip area usage, increased difficulty in the auto placement and route, and the violation in the design rule check.

Conventionally, to follow the restricted design rules, several approaches may be taken. These approaches include increasing cell area to avoid design rule violation, taking more metal routing resource to minimize design rule violation, increasing the usage in the chip area to solve the auto placement and route problem, sacrificing poly critical dimension (CD) control to lower the usage rate in metallization layer 2 (M2), and reducing the sizes of some of the transistors to less-than-desirable-values to lower the usage rate in M2.

Figure 1A:
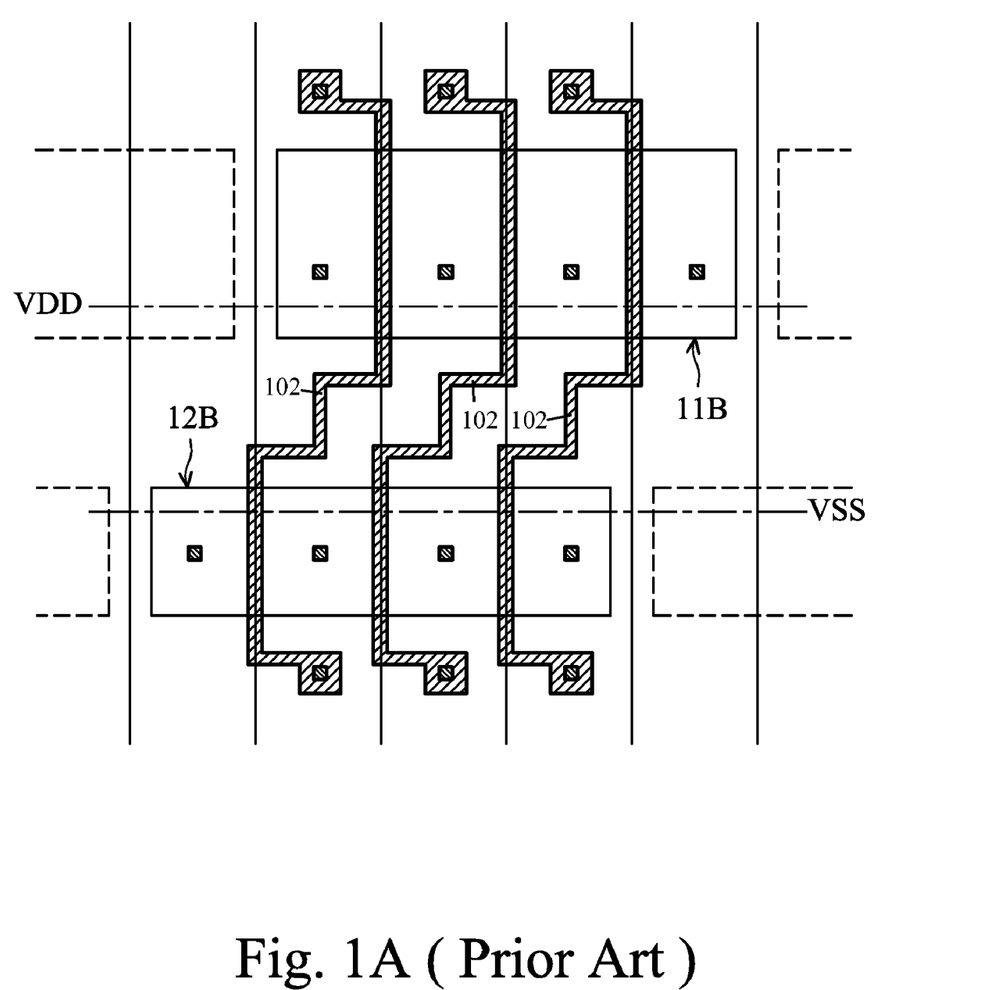
FIGS. 1A and 1B illustrate conventional layouts including PMOS transistors connected to NMOS transistors.

To explain the above-discussed problems, FIG. 1A is illustrated to show an exemplary conventional layout of a portion of a gate array device, which includes polysilicon lines 102 forming PMOS transistors with diffusion region 11B, and forming NMOS transistors with diffusion region 12B. It is noted that polysilicon lines 102 are twisted with several turns. In small-scale integrated circuits, particularly 45 nm and below, such twisted polysilicon lines will cause critical dimension (CD) variations. Further, limited by design rules, the twisted polysilicon lines also require more chip areas to allow adequate space between the polysilicon lines 102 and between each of the polysilicon lines 102 and neighboring features.

Figure 1B:
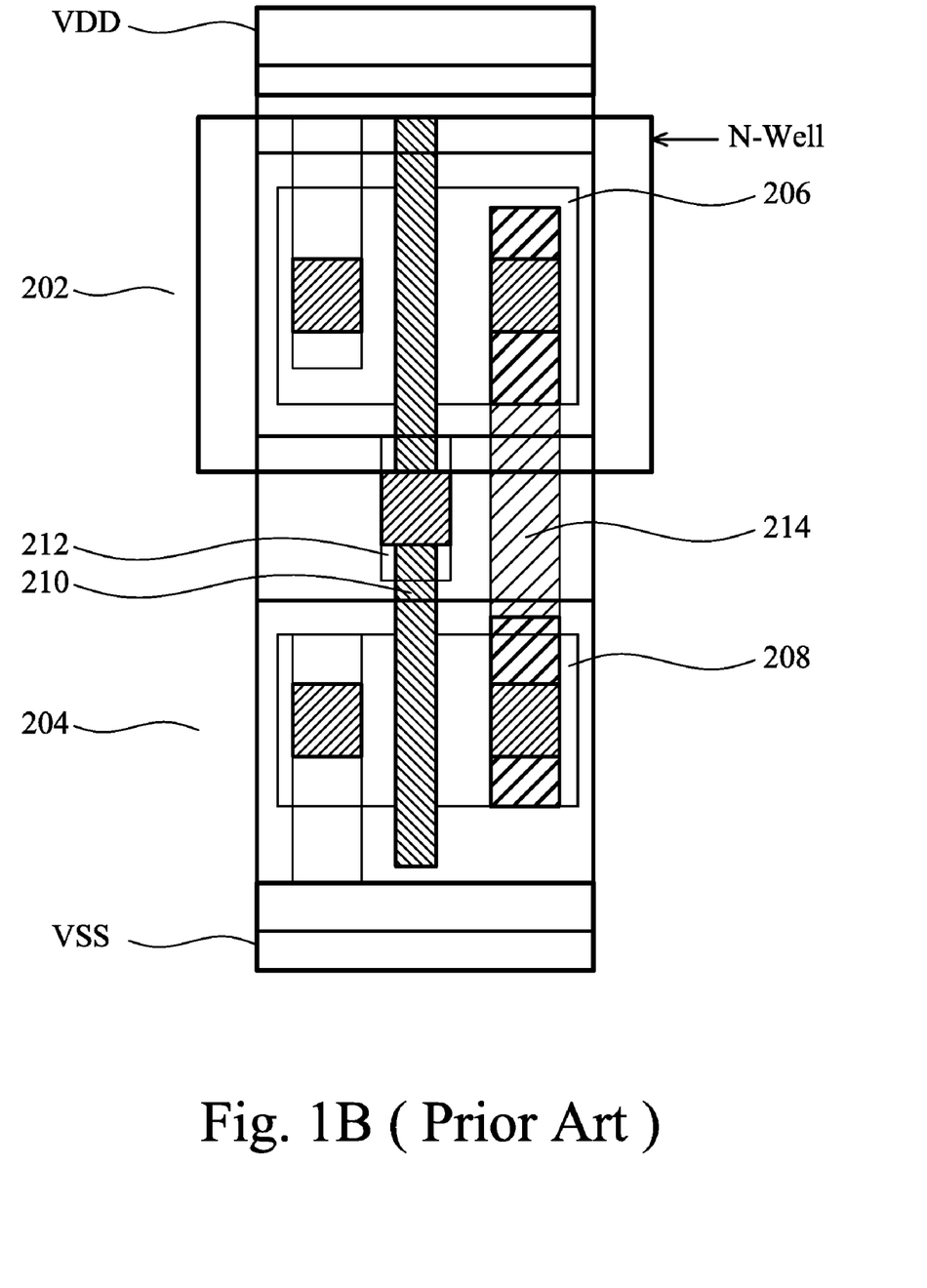

FIG. 1B is illustrated to show an exemplary conventional layout of a standard cell, which includes PMOS transistor 202 interconnected to NMOS transistor 204. Gate poly 210 extends over active regions 206 and 208. Interconnection port 212 is formed between PMOS transistor 202 and NMOS transistor 204, and is connected to gate poly 210. Metal 214 interconnects the drains of PMOS transistor 202 and NMOS transistor 204. The standard cell layout shown in FIG. 1 suffers from drawbacks when used in very small-scale integrated circuits. It is noted that interconnection port 212 and metal 214 are closely located. For very small-scale integrated circuits, the distance between interconnection port 212 and metal 214 becomes so small, that the layout violates the restricted design rules. Further, at the location gate poly 210 is connected to interconnection port 212, gate poly 210 needs to be wider than the portions directly over active regions 206 and 208, and hence the line width uniformity of gate poly 210 is adversely affected. The possible methods for fixing the problem include shifting interconnection port 212 to the left (which method is referred to as poly jog), or route the connection of the drains of PMOS transistor 202 and NMOS transistor 204 through high-level of metals including metallization layer 2 (M2) or higher, so that metal 214 is not in a same metallization layer as interconnection port 212. However, these methods (such as poly jog) either violate further design rules, or cause the undesirable increase in M2 usage rate. New methods for solving the above-discussed problems are thus needed.

SUMMARY OF THE INVENTION

In accordance with one aspect of the present invention, an integrated circuit structure including a PMOS transistor including a first gate electrode; a first source region; and a first drain region; an NMOS transistor including a second gate electrode, wherein the first and the second gate electrodes are portions of a gate electrode strip; a second source region; and a second drain region. No additional transistors are formed between the PMOS and the NMOS transistors. The integrated circuit further includes a VDD power rail connected to the first source region; a VSS power rail connected to the second source region; and an interconnection port electrically connected to the gate electrode strip. The interconnection port is on an outer side of a MOS pair region including the PMOS transistor, the NMOS transistor, and the region between the PMOS and the NMOS transistors. The portion of the gate electrode strip in the MOS pair region is substantially straight.

In accordance with another aspect of the present invention, an integrated circuit structure includes a cell including a first active region; a second active region adjacent the first active region with substantially no active region there between; and a gate electrode strip over the first and the second active regions to form a p-type metal-oxide-semiconductor (PMOS) transistor and an n-type metal-oxide-semiconductor (NMOS) transistor, respectively. Gate length directions of the PMOS transistor and the NMOS transistor are substantially parallel to each other. The gate electrode strip is substantially straight with a substantially uniform width in a region directly over the PMOS and the NMOS transistor, and in a region between the PMOS transistor and the NMOS transistor. The integrated circuit structure further includes a metal line interconnecting a first drain region of the PMOS transistor and a second drain region of the NMOS transistor, wherein the metal line is substantially parallel to the gate electrode strip; a VDD power rail having at least a portion overlapping the first active region, wherein the VDD power rail and a first source region of the PMOS transistor are electrically interconnected; a VSS power rail having at least a portion overlapping the second active region, wherein the VSS power rail and a second source region of the NMOS transistor are electrically interconnected; and a contact plug vertically overlapping, and electrically connected to, the gate electrode strip. One of the first and the second active regions is horizontally between the first contact plug and a remaining one of the first and the second active regions.

In accordance with yet another aspect of the present invention, an integrated circuit structure includes a PMOS transistor and an NMOS transistor adjacent to the PMOS transistor. Gate length directions of the PMOS and the NMOS transistors are substantially parallel to each other. There is substantially no active region between the PMOS and the NMOS transistors. The integrated circuit structure further includes a gate electrode strip, wherein a first portion and a second portion of gate electrode strip form gates of the PMOS transistor and the NMOS transistor, respectively, and wherein the PMOS transistor includes a first source region and a first drain region, and the NMOS device includes a second source region and a second drain region. The integrated circuit structure further includes a metal line connecting the first drain region of the PMOS device to the second drain region of the NMOS device; a first contact plug directly over, and connected to, the first source region; a second contact plug directly over, and connected to, the second source region; and a third contact plug overlapping and electrically connected to the gate electrode strip. One of the first and the second contact plugs is horizontally between the third contact plug and a remaining one of the first and the second contact plugs.

In accordance with yet another aspect of the present invention, an integrated circuit structure includes a first cell and a second cell. The first cell includes a first power rail for supplying a VDD voltage potential and coupled to a source of a first transistor; a second power rail for supplying a VSS voltage potential and coupled to a source of a second transistor; and a first interconnection port coupled to a first common interconnection layer of the first cell through a first contact plug. The first interconnection port is not disposed between the first power rail and the second power rail. The first common interconnection layer forms gates of the first transistor and the second transistor. The second cell is adjacent to the first cell and laid out in substantially a mirrored pattern of the first cell. The second cell includes a third power rail for supplying the VDD voltage potential and coupled to a source of a third transistor; a fourth power rail for supplying the VSS voltage potential and coupled to a source of a fourth transistor; and a second interconnection port coupled to a second common interconnection layer of the second cell through a second contact plug. The second interconnection port is not disposed between the third and the fourth power rails. The first and the second interconnection ports are both disposed between the first and the third power rail or between the second and the fourth power rails.

By using the embodiments of the present invention, the performance of the resulting circuit may be improved without violating advance design rules.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4A through 6 illustrate various layouts for two neighboring cells, each comprising a PMOS transistor and an NMOS transistor;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for laying out standard cells and the resulting layouts are provided. The variations of the preferred embodiment are discussed. Throughout the various views and illustrative embodiments of the present invention, like reference numbers are used to designate like elements. Throughout the description, the terms "horizontal" and "horizontally" indicate the directions parallel to the surface of the chip in which the circuits of the present invention are to be located, and the terms "vertical" and "vertically" indicate the directions perpendicular to the surface of the chip.

Figure 2:
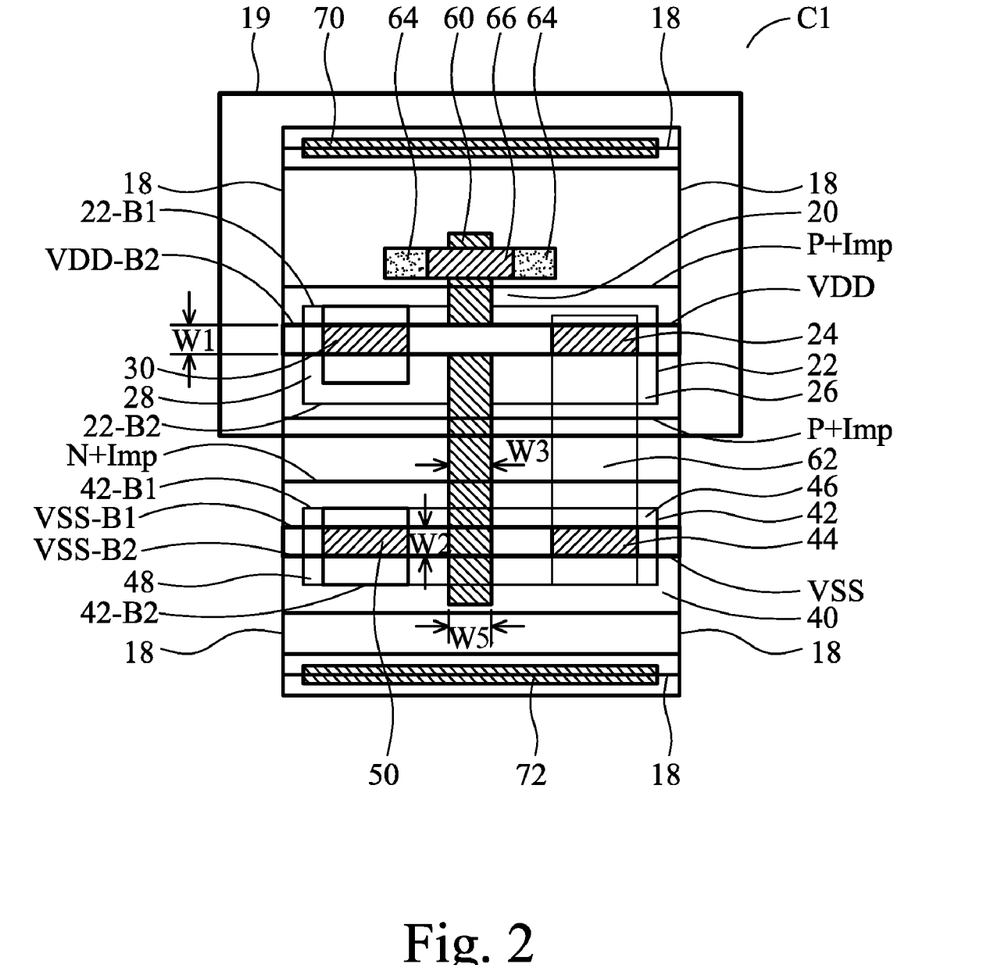
FIGS. 2 and 3 illustrate embodiments of the present invention, wherein an interconnection port of a cell including a PMOS transistor and an NMOS transistor is formed on an outer side of the PMOS transistor and the NMOS transistor.

FIG. 2 illustrates an embodiment of the present invention, wherein a layout of a portion of cell C1 is illustrated. Cell C1 may be a portion of a standard cell that may be stored in a cell library, an input/output cell, an embedded cell, a dynamic random access memory (DRAM) cell, a static random access memory (SRAM) cell, a mixed-signal circuit cell, or the like. The boundary of cell C1 is illustrated by rectangle 18.

Cell C1 includes PMOS transistor 20 and NMOS transistor 40 closely located to each other. Preferably, no additional MOS transistors and no additional active regions are located between transistors 20 and 40. PMOS transistor 20 includes a portion of gate electrode strip (alternatively referred to as a common interconnection layer hereinafter) 60 over active region 22, wherein portions of active region 22 uncovered by gate electrode strip 60 are heavily doped with a p-type impurity to form drain region 26 and source region 28. Active region 22 is located in n-well region 19. NMOS transistor 40 includes a portion of gate electrode strip 60 over active region 42, wherein portions of active region 42 uncovered by gate electrode strip 60 are heavily doped with an n-type impurity to form drain region 46 and source region 48. NMOS transistor 40 may be formed in a p-well region (not shown), or directly in a p-type substrate. The implantation of active regions 22 and 42 may be performed using the masks marked as "P+ Imp" and "N+ Imp," respectively. Throughout the description, the term "heavily doped" is used to refer to impurity concentrations of greater than about $10^{19}/cm^3$. It is realized, however, that the term "heavily doped" is a term of art, and may be used to refer to different impurity concentrations in different technology generations. In the preferred embodiment, the gate length directions (the source-drain regions) of MOS transistors 20 and 40 are substantially parallel to each other. Through contact plugs 24 and 44 and metal line 62, the drain region 26 of PMOS transistor 20 is connected to the drain region 46 of NMOS transistor 40. In an exemplary embodiment, gate electrode strip 60 and (the lengthwise direction of) metal line 62 are parallel to each other.

In the preferred embodiment, a VDD power rail (marked as "VDD" in FIG. 2) vertically overlaps, and is electrically connected to, contact plug 30. Contact plug 30 is directly over and electrically connected to source region 28 of PMOS transistor 20. Similarly, a VSS power rail (marked as "VSS"

in FIG. 2) vertically overlaps, and is electrically connected to, contact plug 50. Contact plug 50 is directly over and electrically connected to source region 48 of PMOS transistor 40.

In an embodiment, the VDD power rail has at least a portion directly over active region 22. Therefore, the edge VDD_B1 of the VDD power rail may be directly over active region 22. Alternatively, the width W1 of the VDD power rail may be increased, so that edge VDD_B1 of the VDD power rail overlaps the boundary 22_B1 of active region 22. Edge VDD_B1 may also be located horizontally between boundary 22_B1 and interconnection port 64. The VDD power rail may be in metallization layer 2 (M2), metallization layer 3 (M3), metallization layer 4 (M4), and so on. Accordingly, there may be a via (not shown) connecting metallization layer 1 (M1, which is also the bottom metallization immediately over contact plugs) metal line and M2 metal line, and the via vertically overlaps and is electrically connected to contact plug 30. Further, the VDD power rail may have an even greater width, so that it has a portion vertically overlap (without electrically connected to) a portion of interconnection port 64. Similarly, the edge VDD_B2 of the VDD power rail may be directly over active region 22, or overlap the boundary 22_B2 of active region 22. Alternatively, edge VDD_B2 may extend beyond the edge of active region 22.

The VSS power rail has at least a portion directly over active region 42. Similarly, the edge VSS_B2 of the VSS power rail may be directly over active region 42. Alternatively, the edge VSS_B2 of the VSS power rail may overlap the boundary 42_B2 of active region 42. The VSS Power rail may be in metallization layers M2, M3, M4, or the like. Accordingly, there may be a via connecting M1 metal line and M2 metal line, and the via vertically overlaps and is electrically connected to contact plug 50. On the other hand, the edge VSS_B1 of the VSS power rail may be directly over active region 42, or overlap the boundary 42_B1 of active region 42. Alternatively, edge VSS_B2 may extend beyond the edge of active region 42.

Interconnection port 64, which is a metal pad or a metal line in metallization layer M1, is outside the region (referred to as MOS pair region hereinafter) defined by PMOS transistor 20, NMOS transistor 40, and the region there between. Interconnection port 64 is electrically connected to gate electrode strip 60. Alternatively, interconnection port 64 may be a metal pad or a metal line in another metallization layer such as M2, M3, or the like. In an embodiment, as shown in FIG. 2, interconnection port 64 is located on the side of PMOS transistor 20. Accordingly, the contact plug 66, which interconnects gate electrode strip 60 and interconnection port 64, is also outside the MOS pair region and adjacent to PMOS transistor 20. In alternative embodiments, as shown in FIG. 3, interconnection port 64 and contact plug 66 are outside the MOS pair region and adjacent to NMOS transistor 40.

Referring again to FIG. 2, optionally, N+ pick-up region 70 is formed as a pick-up region of n-well 19. In an embodiment, N+ pick-up region 70 is such located, that interconnection port 64 is located horizontally between N+ pick-up region 70 and the VDD power rail, although interconnection port 64, N+ pick-up region 70, and the VDD power rail may be at different vertical levels if illustrated in a cross-sectional view. Similarly, P+ pick-up region 72 may optionally be formed, and may be directly in the p-type substrate, or in the respective p-well (not shown), if any. In alternative embodiments, pick-up regions 70 and 72 may be located in other locations such as the left or right side of the respective PMOS transistor 20 and NMOS transistor 40. Pick-up regions 70 and 72 may be located on the cell boundary 18, so that they can be shared by neighboring cells. Alternatively, the entireties of pick-up regions 70 and 72 are inside cell C1.

It is noted that by moving interconnection port 64 to outside the MOS pair region, gate electrode strip 60 may be substantially straight, which not only means that widths W3, W4 and W5 of different portions of gate electrode strip 60 are substantially the same, but also means the gate electrode strip 60 is a substantially straight line. At least, in the MOS pair region, which is a high pattern-density area, the gate electrode strip 60 is preferably substantially straight and has a substantially uniform line width. However, in this case, the portion of gate electrode strip 60 connected to contact plug 66 may be wider, forming a jog (not shown, underneath contact plug 66) outside the MOS pair region. Advantageously, with the possible jogs outside the MOS pair region and in a relatively low pattern-density region, the adverse effect caused by the jogs may be reduced.

Figure 3:
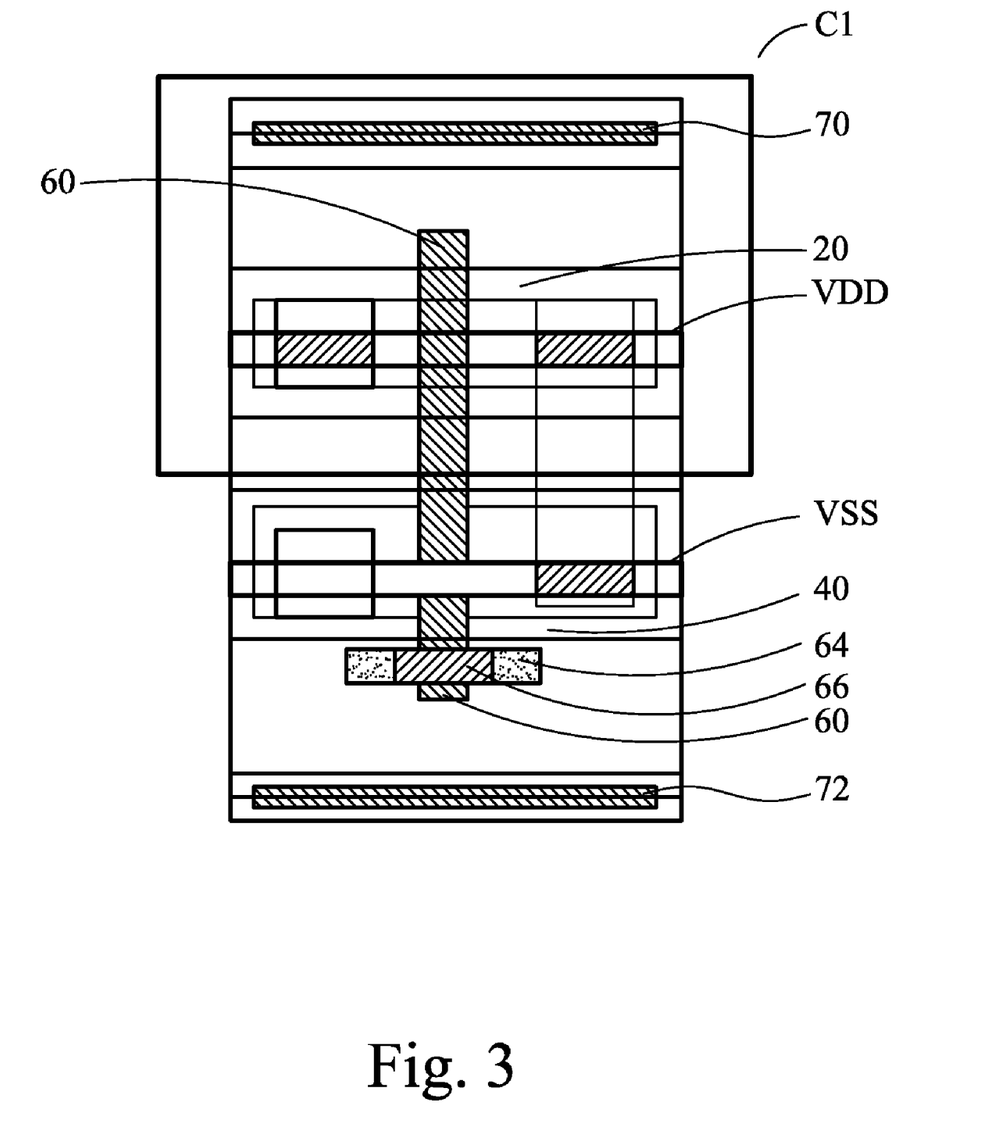

Referring to FIG. 3, instead of being formed close to PMOS transistor 20, interconnection port 64 and contact plug 66 may also be formed outside the MOS pair region and close to NMOS transistor 40. Accordingly, interconnection port 64 and contact plug 66 are between the VSS power rail and P+ pick-up region 72. In other words, interconnection port 64 and contact plug 66 may be horizontally between NMOS transistor 40 and P+ pick-up region 72, although they may be at different vertical levels.

Figure 4A:
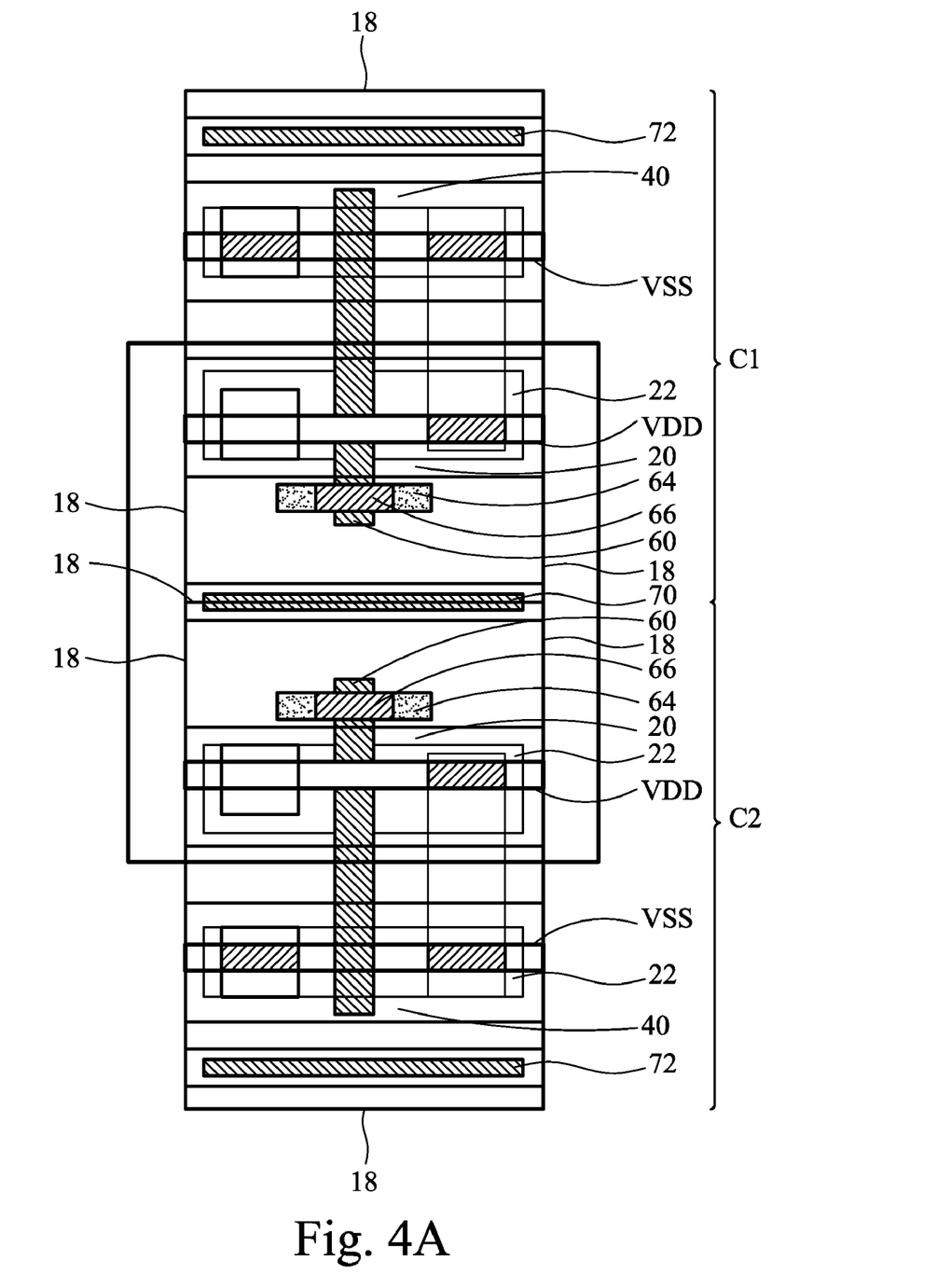
Figure 5:
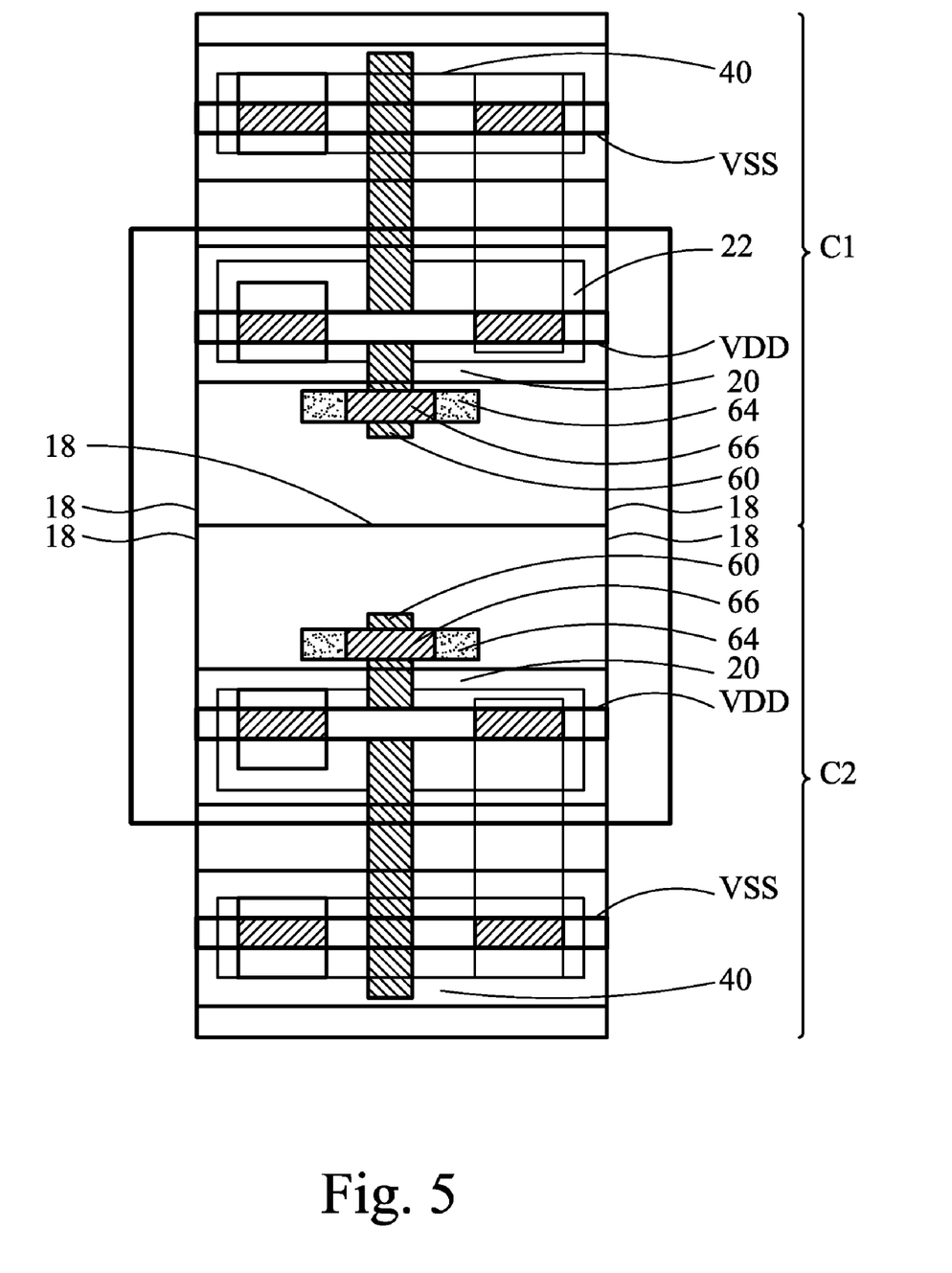

The cells similar to cell C1 may be repeated in integrated circuits. FIG. 4A illustrates an embodiment including cells C1 and C2, wherein each of the cells C1 and C2 has essentially the same structure as the cell C1 illustrated in FIG. 2 or 3. Cell C2 has a mirrored structure of cell C1. In an embodiment, cells C1 and C2 share N+ pick-up region 70, which have a portion in cell C1 and a portion in cell C2. In alternative embodiments, as shown in FIG. 5, no pick-up region 70 (and/or pick-up region 72) is formed at the boundaries of cells C1 and C2. Accordingly, interconnection port 64 and contact plug 66 in either of the cells C1 and C2 are formed between the active regions 22 of cell C1 and the active regions 22 of cell C2. It is noted that in FIG. 4A, interconnection ports 64 are formed between, and close to, two power rails VDD, each belonging to one of the cells C1 and C2, with no VSS power rail between any of the interconnection ports 64 and any of the VDD power rails. Further, in FIG. 4A and other embodiments of the present invention, the VDD, VSS power rails in cells C1 and C2 are preferably formed in a same metallization layer, for example, M2. Interconnection port 64 of cells C1 and C2 are also preferably in a same metallization layer, for example, M1.

Figure 4B:
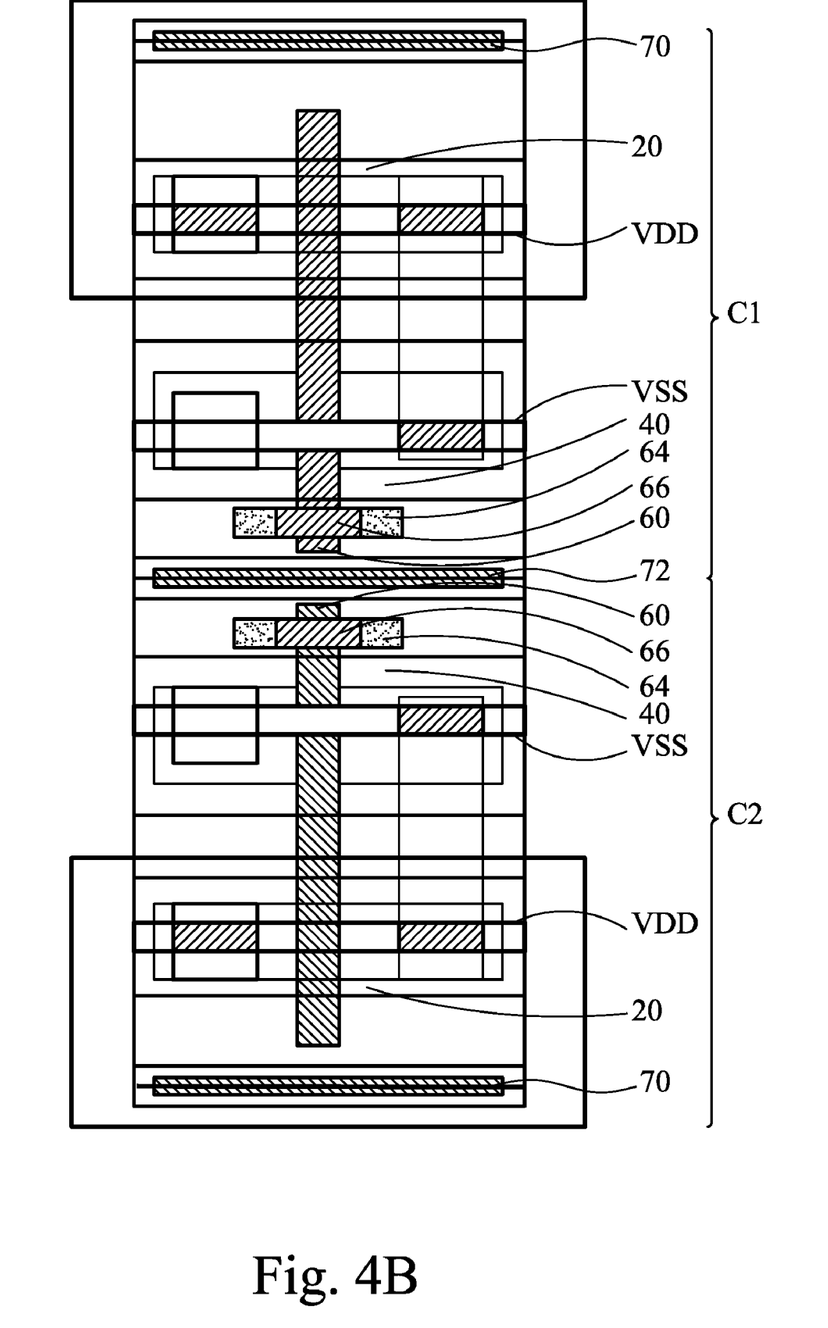

FIG. 4B illustrates a similar structure as shown in FIG. 4A, except the interconnection port 64 and contact plug 66 are formed close to NMOS transistor 40 instead of PMOS transistor 20. Similarly, there may be a P+ pick-up region 72 formed at the boundaries of cells C1 and C2. Alternatively, the P+ pick-up region 72 may be omitted. It is noted that in FIG. 4B, interconnection ports 64 are formed between, and close to two power rails VSS, each belonging to one of the cells C1 and C2, with no VDD power rails between any of the interconnection ports 64 and any of the VSS power rails.

Figure 6:
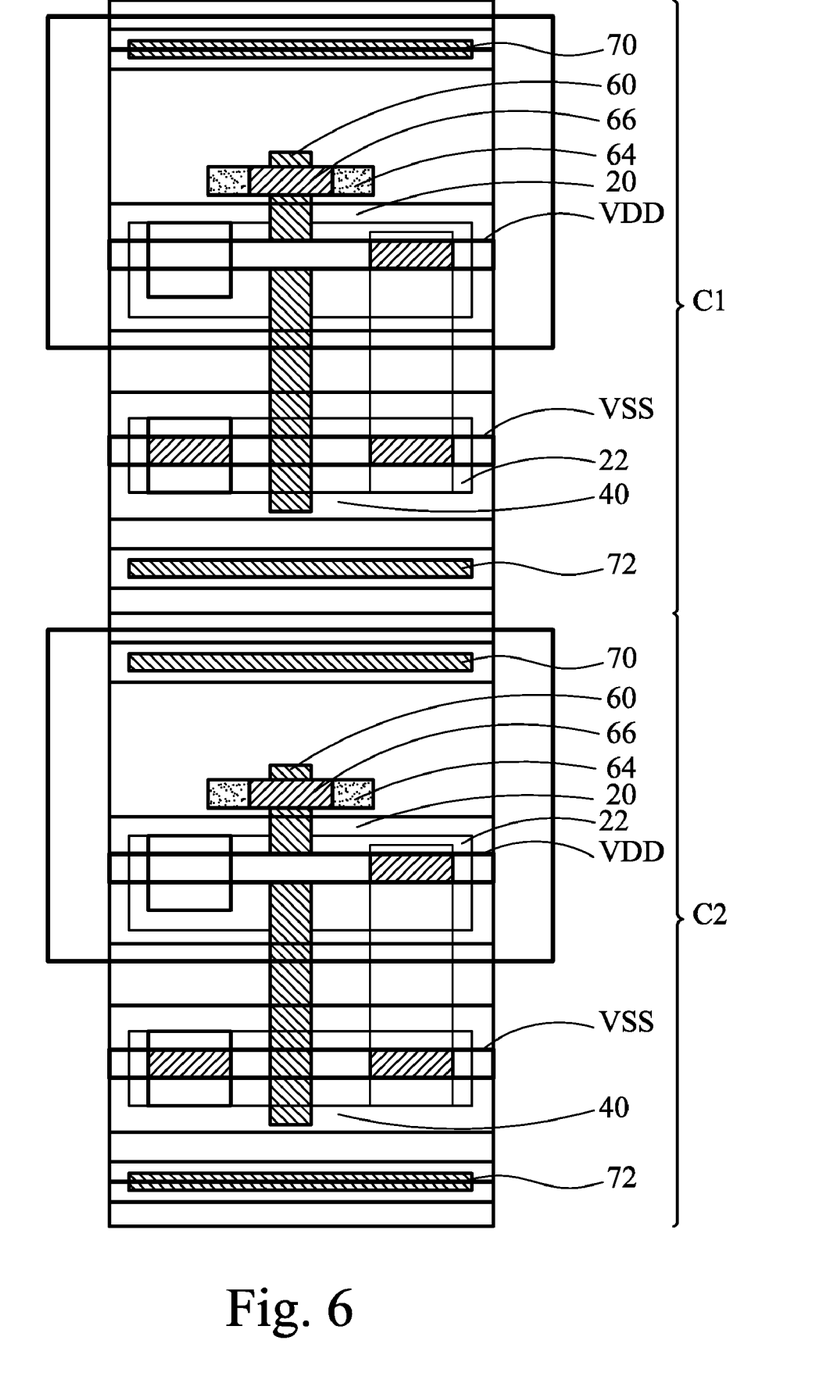

FIG. 6 illustrates an alternative embodiment. Instead of forming two mirrored cells C1 and C2 next to each other, cells C1 and C2 are arranged in a same direction. Accordingly, interconnection port 64 and contact plug 66 will be located between and close to the active region 42 of cell C1 and the active region 22 of cell C2. Again, pick-up regions 70 and 72 may be formed close to the boundaries of cells C1 and C2, omitted, or placed in other locations.

Figure 7:
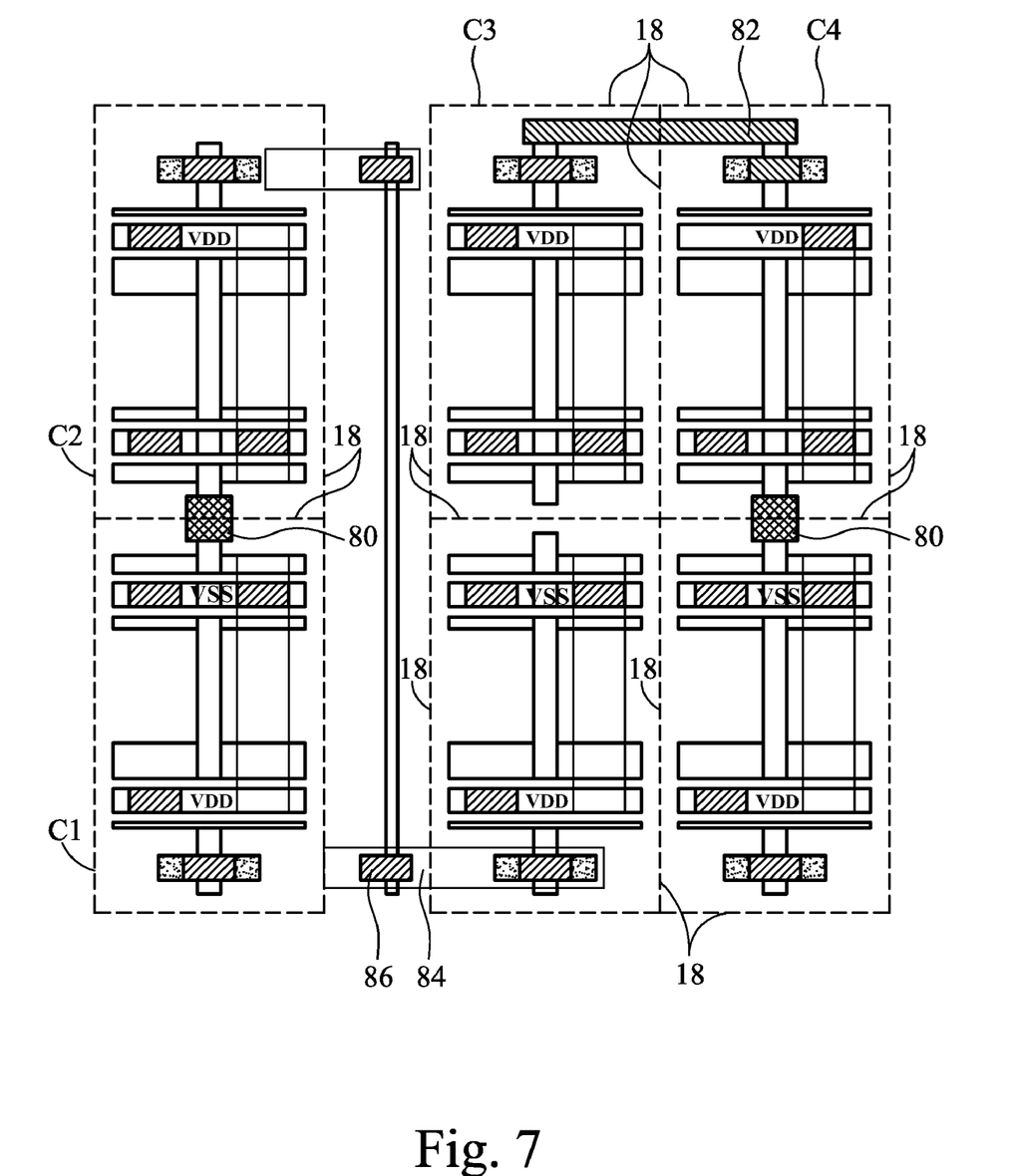
FIG. 7 illustrates an embodiment with metals used for forming gate electrode strips.

It is noted that although gate electrode strip 60 as discussed in the preceding paragraphs may be formed of polysilicon, it can also be formed of metals or metal alloys. In which case, as shown in FIG. 7, the underlying gate dielectric (not shown) for separating the gate electrode strip 60 and the underlying substrate may be formed of high-k dielectric materials, or example, with k values greater than 3.9. With relatively low resistivities of metal gate electrode strips, the layout of the standard cells may be more flexible. For example, jogs 80 may be formed at the cell boundaries 18 between cells C1 and C2, wherein the jogs 80 are simply portions of gate electrode strip 60 wider than other portions. Alternatively, gate electrode strips 60 of cells C1 and C2 may be interconnected seamlessly, with the supposedly jog portions having a same width as other portions, for example, the portions in the MOS pair portions.

Further, metal gate electrode strips 82 may be formed to interconnect different cells, such as cells C3 and C4. With the help of metal gate electrode strips, a further high-level metal layer 84 and contact plug 86 may be used to make further local interconnections.

Figure 8:
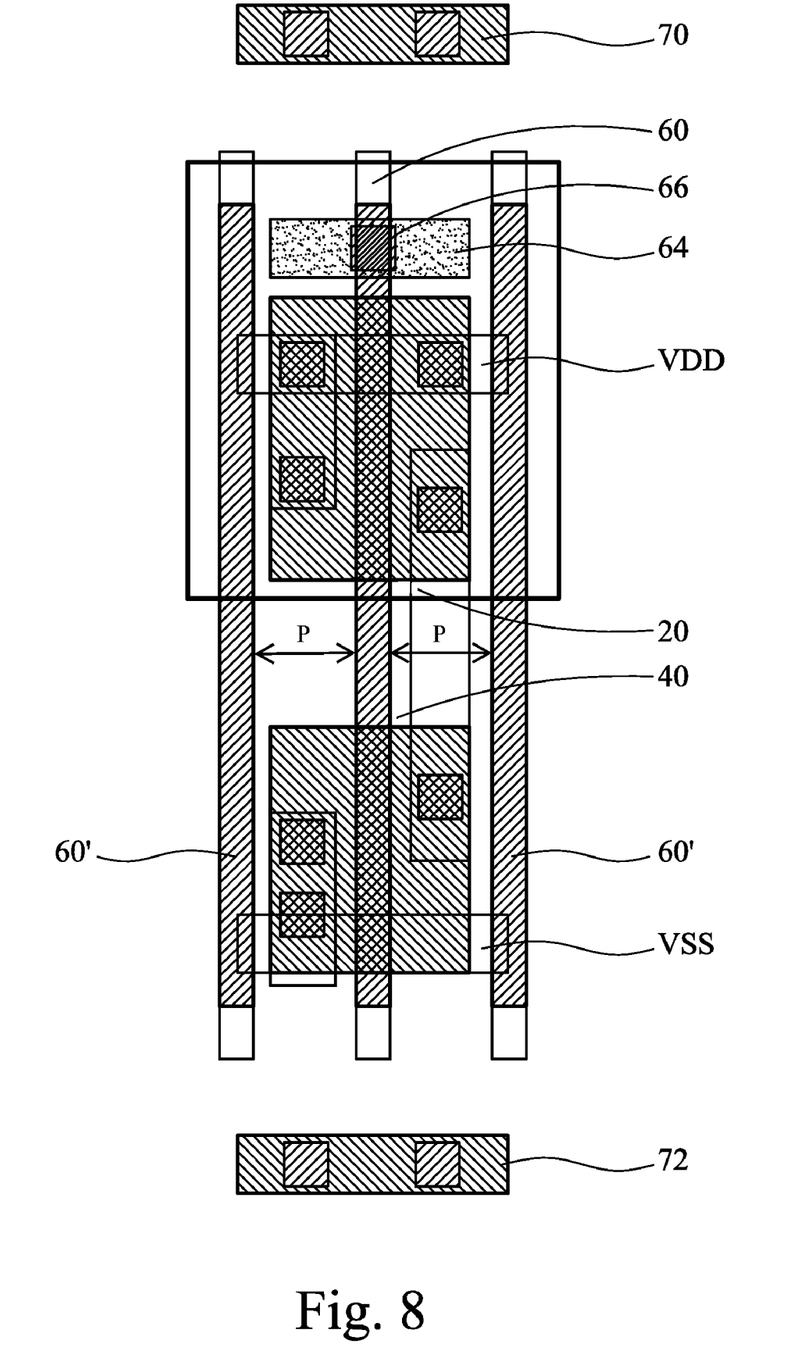
FIG. 8 illustrates an exemplary layout of an inverter.

The embodiments discussed in the preceding paragraphs may be used on many applications. FIG. 8 illustrates a layout of an inverter comprising PMOS transistor 20 and NMOS transistor 40. Like elements in FIG. 8 are denoted with like reference numerals as in FIGS. 2 and 3. FIG. 8 illustrates dummy gate electrode strips 60', which preferably have substantially the same width as gate electrode strip 60. Again, with gate electrode strip 60 being substantially straight and having substantially uniform line widths, dummy gate electrode strips 60' may also be substantially straight with substantially uniform line widths. Further, the pitch P between dummy gate electrodes strips 60' and gate electrode strip 60 may be the same.

Figure 9:
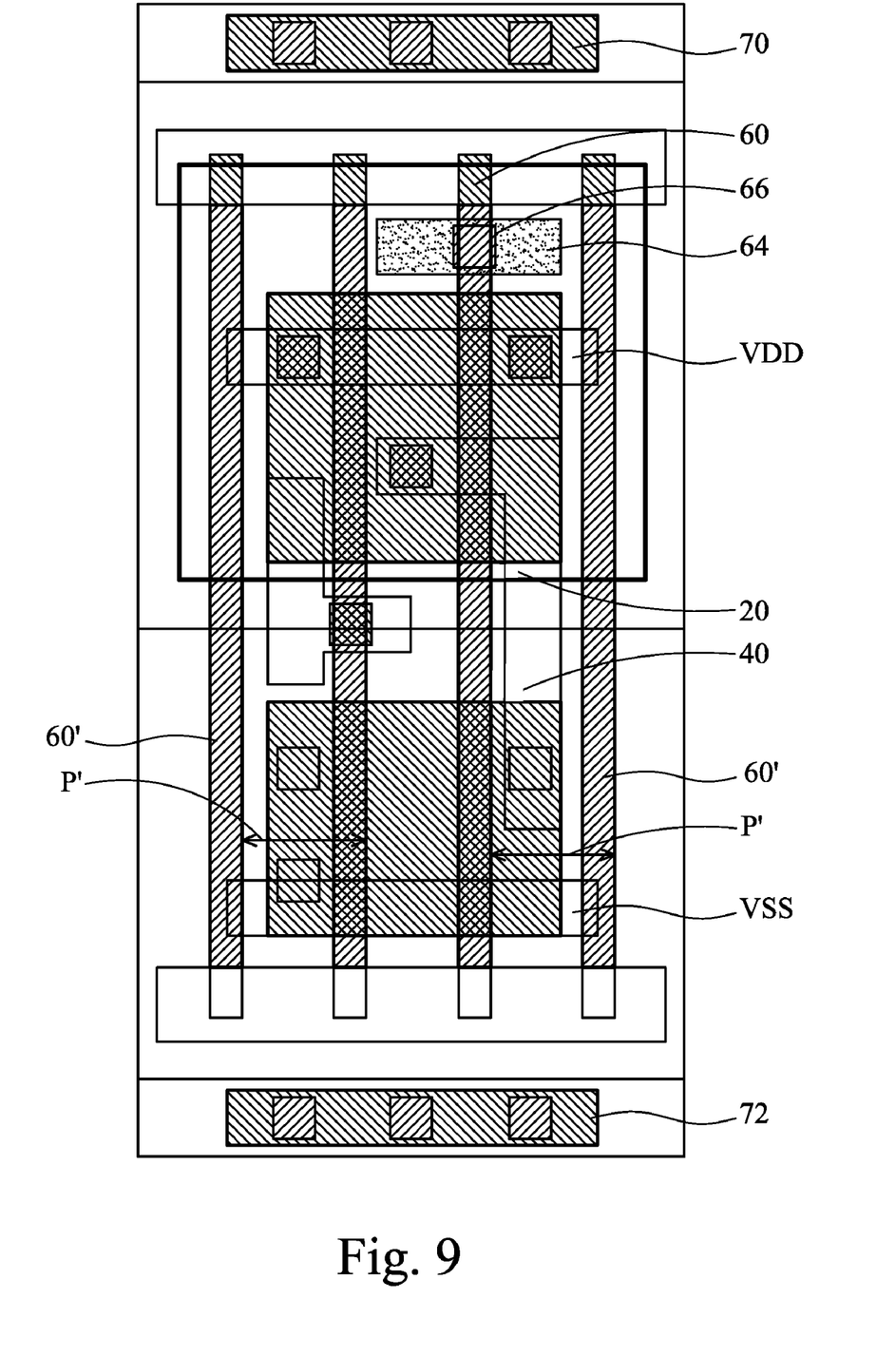
FIG. 9 illustrates an exemplary layout of an NAND memory cell.

FIG. 9 illustrates a layout of a NAND memory cell, which also includes PMOS transistor 20 and NMOS transistor 40. Again, interconnection port 64 and contact plug 66 are formed on an outer side of the VDD power rail and the VSS power rail, which are connected to the drain regions of the PMOS transistor 20 and NMOS transistor 40, respectively. In the embodiment shown in FIG. 9, interconnection port 64 and contact plug 66 are closer to the VDD power rail. In alternative embodiment, interconnection port 64 and contact plug 66 may be closer to the VSS power rail, similar to the case shown in FIG. 3. Similar to FIG. 8, FIG. 9 also illustrates that with gate electrode strip 60 being substantially straight and having substantially uniform line widths, dummy gate electrode strips 60' may also be substantially straight with substantially uniform line widths. Further, the pitches P' between dummy gate electrode strips 60' and gate electrode strip 60 may be the same.

The inverter shown in FIG. 8 may be formed next to other inverters, wherein the two inverters may be laid out using essentially the same schemes as shown in FIGS. 4A, 4B, 5, and 6. One skilled in the art will realize the corresponding layouts using the teaching provided for FIGS. 4A, 4B, 5, and 6, and hence the respective layouts are not shown herein. Similarly, the NAND cell shown in FIG. 9 may be formed next to other NAND cells, again using essentially the same layout schemes as shown in FIGS. 4A, 4B, 5, and 6.

Figure 10A:
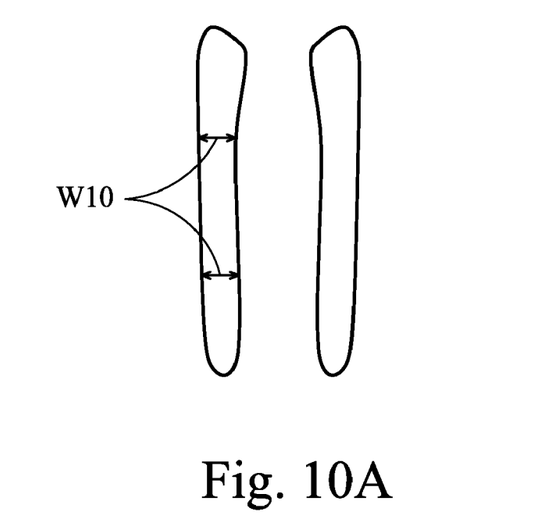
FIG. 10A illustrates a gate electrode strip reproduced from a scanning electron microscope (SEM) photo of an embodiment of the present invention, wherein the gate electrode strip has a substantially uniform line width.
Figure 10B:
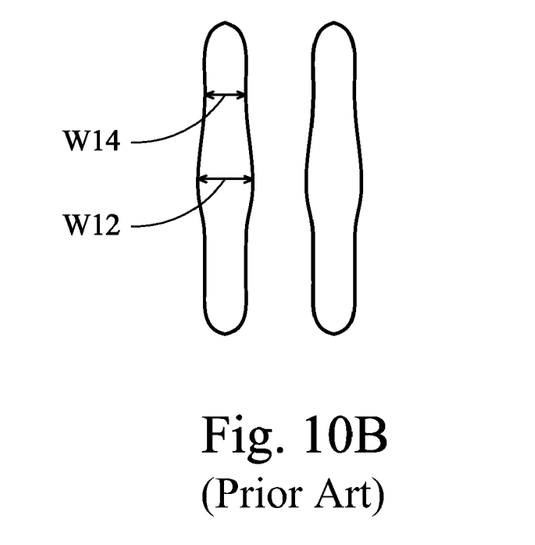
FIG. 10B illustrates an additional gate electrode strip reproduced from an SEM photo of a conventional layout, wherein the line widths of the additional gate electrode strip vary significantly.

The embodiments of the present invention have several advantageous features. By laying out interconnection port outside the MOS pair region, the line uniformity of gate electrode strip 60 (refer to FIG. 2) is improved. FIG. 10A illustrates a figure reproduced from a scanning electron microscope (SEM) photo. It is noted that gate electrode strip 60 has a substantially uniform line width W10. As a comparison, as shown in FIG. 10B, in a conventional layout in which an interconnection port is formed between a PMOS transistor and an NMOS transistor, the line widths W12 and W14 may vary significantly. FIG. 10B is also reproduced from an SEM photo. Simulation results have shown that the speeds of the embodiments of the present invention are about 6.5 percent to about 8.1 percent faster than the conventional layouts having interconnection port laid out between a PMOS transistor and an NMOS transistor. Further, the embodiments of the present invention have the advantageous features of reduced M2 usage, easiness in placement and route, and flexibility in the layout of power rails.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
    a p-type metal-oxide-semiconductor (PMOS) transistor comprising:
        a first gate electrode;
        a first source region adjacent the first gate electrode; and
        a first drain region adjacent to, and on an opposite side of, the first gate electrode than the first source region;
    an n-type metal-oxide-semiconductor (NMOS) transistor comprising:
        a second gate electrode, wherein the first gate electrode and the second gate electrode are portions of a gate electrode strip;
        a second source region adjacent the first gate electrode; and
        a second drain region adjacent to, and on an opposite side of, the second gate electrode than the second source region, wherein no additional transistors are formed between the PMOS and the NMOS transistors;
    a VDD power rail connected to the first source region;
    a VSS power rail connected to the second source region; and
    an interconnection port electrically connected to the gate electrode strip, wherein the interconnection port is on an outer side of a MOS pair region comprising the PMOS transistor, the NMOS transistor, and the region between the PMOS and the NMOS transistors, and wherein the portion of the gate electrode strip in the MOS pair region is substantially straight.

2. The integrated circuit structure of claim 1, wherein the portion of the gate electrode strip in the MOS pair region has a substantially uniform line width.

3. The integrated circuit structure of claim 1, wherein the interconnection port is on an opposite side of the VDD power rail than the VSS power rail.

4. The integrated circuit structure of claim 3 further comprising an N+ pick-up region, wherein the interconnection port is between the N+ pick-up region and the VDD power rail.

5. The integrated circuit structure of claim 1, wherein the interconnection port is on an opposite side of the VSS power rail than the VDD power rail.

6. The integrated circuit structure of claim 5 further comprising a P+ pick-up region, wherein the interconnection port is between the P+ pick-up region and the VSS power rail.

7. The integrated circuit structure of claim 1, wherein the VDD power rail has at least a portion directly over the PMOS transistor, and wherein the VSS power rail has at least a portion direction over the NMOS transistor.

8. The integrated circuit structure of claim 7 further comprising:
   a first contact plug electrically connecting the first source region to the VDD power rail, wherein the VDD power rail has at least a portion vertically overlapping the first contact plug; and
   a second contact plug electrically connecting the second source region to the VSS power rail, wherein the VSS power rail has at least a portion vertically overlapping the second contact plug.

9. The integrated circuit structure of claim 1 further comprising:
   an additional PMOS transistor;
   an additional NMOS transistor adjacent the additional PMOS transistor with no transistors there between, wherein gates of the additional PMOS transistor and the additional NMOS transistor are portions of an additional gate electrode strip;
   an additional VDD power rail connected to a source region of the additional PMOS transistor;
   an additional VSS power rail connected to a source region of the additional NMOS transistor; and
   an additional interconnection port electrically connected to the additional gate electrode strip, wherein the additional interconnection port is horizontally between the PMOS transistor and the additional PMOS transistor with no MOS transistors there between.

10. The integrated circuit structure of claim 9, wherein the gate electrode strip and the additional gate electrode strip are metal strips, and wherein the integrated circuit structure further comprises a jog connecting, and formed of same materials as, the gate electrode strip and the additional gate electrode strip.

11. The integrated circuit structure of claim 10, wherein the PMOS transistor and the NMOS transistor are in a first cell, the additional PMOS transistor and the additional NMOS transistor are in a second cell, and wherein the jog is at a boundary of the first cell and the second cell.

12. The integrated circuit structure of claim 9 further comprising an N+ pick-up region between the interconnection port and the additional interconnection port.

13. The integrated circuit structure of claim 1 further comprising a dummy gate electrode strip parallel to the gate electrode strip, wherein the dummy gate electrode strip has a substantially uniform line width, and wherein the substantially uniform line width is substantially equal to a line width of the gate electrode strip.

14. An integrated circuit structure comprising:
   a first cell comprising:
      a first active region;
      a second active region adjacent the first active region with substantially no active region there between;
      a gate electrode strip over the first active region and the second active region to form a p-type metal-oxide-semiconductor (PMOS) transistor and an n-type metal-oxide-semiconductor (NMOS) transistor, respectively, wherein gate length directions of the PMOS transistor and the NMOS transistor are substantially parallel to each other, and wherein the gate electrode strip is substantially straight with a substantially uniform width in a region directly over the PMOS transistor and the NMOS transistor, and in a region between the PMOS transistor and the NMOS transistor;
      a metal line interconnecting a first drain region of the PMOS transistor and a second drain region of the NMOS transistor, wherein the metal line is substantially parallel to the gate electrode strip;
      a VDD power rail having at least a portion overlapping the first active region, wherein the VDD power rail and a first source region of the PMOS transistor are electrically interconnected;
      a VSS power rail having at least a portion overlapping the second active region, wherein the VSS power rail and a second source region of the NMOS transistor are electrically interconnected;
      a first contact plug vertically overlapping, and electrically connected to, the gate electrode strip, wherein one of the first active region and the second active region is horizontally between the first contact plug and a remaining one of the first active region and the second active region; and
   an interconnection port having at least a portion overlapping and electrically connected to the first contact plug.

15. The integrated circuit structure of claim 14 further comprising:
   a second contact plug overlapping and interconnecting the first source region and the VDD power rail; and
   a third contact plug overlapping and interconnecting the second source region and the VSS power rail.

16. The integrated circuit structure of claim 14 further comprising:
   a second cell having a substantially same structure as the first cell, wherein a cell boundary of the first cell substantially overlaps a cell boundary of the second cell, and wherein the first active region and the second active region of the first cell and active regions of the second cell are substantially aligned to a straight line; and
   a pick-up region on the boundaries of the first cell and the second cell.

17. The integrated circuit structure of claim 16, wherein the first cell and the second cell have mirrored structures, and wherein the first contact plug is between the VDD power rail and an additional VDD power rail of the second cell, with no VSS power rail between the first contact plug and the VDD power rail, and no VSS power rail between the first contact plug and the additional VDD power rail.

18. The integrated circuit structure of claim 16, wherein the first cell and the second cell have mirrored structures, and wherein the first contact plug is between the VSS power rail and an additional VSS power rail of the second cell, with no VDD power rail between the first contact plug and the VSS power rail, and no VDD power rail between the first contact plug and the additional VSS power rail.

19. The integrated circuit structure of claim 16, wherein the first cell and the second cell are arranged in a same direction.

20. The integrated circuit structure of claim 16, wherein the first cell and the second cell are laid out in a mirrored pattern, and wherein the gate electrode strip and an additional gate electrode strip of the second cell are connected by a jog formed at a boundary of the first cell and the second cell.

21. The integrated circuit structure of claim 14, wherein the PMOS transistor and the NMOS transistor are portions of an inverter.

22. The integrated circuit structure of claim 21 further comprising a dummy gate electrode strip in the first cell and parallel to the gate electrode strip, wherein the dummy gate electrode strip is substantially straight and has a substantially same width as the gate electrode strip.

23. The integrated circuit structure of claim 14, wherein the PMOS transistor and the NMOS transistor are portions of an NAND memory cell.

24. The integrated circuit structure of claim 23 further comprising a dummy gate electrode strip in the first cell and parallel to the gate electrode strip, wherein the dummy gate electrode strip is substantially straight and has a substantially same width as the gate electrode strip.

25. An integrated circuit structure comprising:
a first cell comprising:
   a first power rail for supplying a VDD voltage potential and coupled to a source of a first transistor;
   a second power rail for supplying a VSS voltage potential and coupled to a source of a second transistor; and
   a first interconnection port coupled to a first common interconnection layer of the first cell through a first contact plug, wherein the first interconnection port is not disposed between the first power rail and the second power rail, and wherein the first common interconnection layer forms gates of the first transistor and the second transistor; and
a second cell adjacent the first cell, wherein the second cell is laid out in a substantially mirrored pattern of the first cell, and wherein the second cell comprises:
   a third power rail for supplying the VDD voltage potential and coupled to a source of a third transistor;
   a fourth power rail for supplying the VSS voltage potential and coupled to a source of a fourth transistor; and
   a second interconnection port coupled to a second common interconnection layer of the second cell through a second contact plug, wherein the second interconnection port is not disposed between the third power rail and the fourth power rail, and wherein the first interconnection port and the second interconnection port are both disposed between the first power rail and the third power rail or between the second power rail and the fourth power rail.

26. The integrated circuit structure of claim 25, wherein the first power rail, the second power rail, the third power rail, and the fourth power rail are formed in a same metal level.

27. The integrated circuit structure of claim 26, wherein the first power rail, the second power rail, the third power rail, and the fourth power rail are formed a the second metallization layer (M2).

28. The integrated circuit structure of claim 25, wherein the first interconnection port and the second interconnection port are in a same metallization layer.

29. The integrated circuit structure of claim 28, wherein the first interconnection port and the second interconnection port are in a first metallization layer (M1).

* * * * *

UNITED STATES PATENT AND TRADEMARK OFFICE
CERTIFICATE OF CORRECTION

| | | |
|---|---|---|
| PATENT NO. | : 7,821,039 B2 | Page 1 of 1 |
| APPLICATION NO. | : 12/193354 | |
| DATED | : October 26, 2010 | |
| INVENTOR(S) | : Tien et al. | |

It is certified that error appears in the above-identified patent and that said Letters Patent is hereby corrected as shown below:

In Col. 12, line 22, claim 27, delete "a the" and insert --in a--.

Signed and Sealed this
Fourth Day of January, 2011

David J. Kappos
*Director of the United States Patent and Trademark Office*